United States Patent [19]

Tonomura

[11] Patent Number: 4,654,633
[45] Date of Patent: Mar. 31, 1987

[54] METHOD AND APPARATUS FOR TRANSFORMING PRESTEL CODES TO NAPLPS CODES

[75] Inventor: Masashi Tonomura, Tokyo, Japan

[73] Assignee: Sony Corporation, Tokyo, Japan

[21] Appl. No.: 840,894

[22] Filed: Mar. 18, 1986

[30] Foreign Application Priority Data

Mar. 20, 1985 [JP] Japan .................................. 60-56333

[51] Int. Cl.⁴ ............................................. H03M 7/00
[52] U.S. Cl. ............................. 340/347 DD; 340/721; 358/142
[58] Field of Search ................ 340/347 DD, 721, 723; 179/2 DP; 358/11, 12, 142

[56] References Cited

U.S. PATENT DOCUMENTS

4,439,759  3/1984  Fleming .............................. 340/723

*Primary Examiner*—Charles D. Miller
*Attorney, Agent, or Firm*—Philip M. Shaw, Jr.

[57] ABSTRACT

A terminal which is capable of receiving, converting and displaying both NAPLPS and PRESTEL coded signals and which includes means for invoking NAPLPS control and character codes, corresponding to the same, received PRESTEL codes, to an in-use table from NAPLPS code look-up tables at the terminal and for separately processing, decoding and converting PRESTEL attribute codes to produce corresponding NAPLPS codes.

12 Claims, 9 Drawing Figures

FIG. 1
Prestel Transmission Codes

| b7 | 0 | 0 | 0 | 0 | 1 | 1 | 1 | 1 |
|---|---|---|---|---|---|---|---|---|
| b6 | 0 | 0 | 1 | 1 | 0 | 0 | 1 | 1 |
| b5 | 0 | 1 | 0 | 1 | 0 | 1 | 0 | 1 |
| b4 b3 b2 b1 / Row / Col | 0 | 1 | 2 | 3 | 4 | 5 | 6 | 7 |
| 0000 / 0 | NUL | | SP | 0 | @ | P | — | p |
| 0001 / 1 | | Cursor on | ! | 1 | A Alphanumeric Red | Q Mosaic Red | a | q |
| 0010 / 2 | | | " | 2 | B Alphanumeric Green | R Mosaic Green | b | r |
| 0011 / 3 | | | £ | 3 | C Alphanumeric Yellow | S Mosaic Yellow | c | s |
| 0100 / 4 | ENQ | Cursor off | $ | 4 | D Alphanumeric Blue | T Mosaic Blue | d | t |
| 0101 / 5 | | | % | 5 | E Alphanumeric Magenta | U Mosaic Magenta | e | u |
| 0110 / 6 | | | & | 6 | F Alphanumeric Cyan | V Mosaic Cyan | f | v |
| 0111 / 7 | | | ' | 7 | G Alphanumeric White | W Mosaic White | g | w |
| 1000 / 8 | Active Position Backward (APB) | | ( | 8 | H Flash | X Conceal Display | h | x |
| 1001 / 9 | Active Position Forward (APF) | | ) | 9 | I Steady | Y Contiguous Mosaics | i | y |
| 1010 / 10 | Active Position Down (APD) | | * | : | J | Z Separated Mosaics | j | z |
| 1011 / 11 | Active Position Up (APU) | ESC | + | ; | K | ↓ | k | ¼ |
| 1100 / 12 | Clear Screen (CS) | | , | < | L Normal Height | ½ Black Background | l | ‖ |
| 1101 / 13 | Active Position Return (APR) | | - | = | M Double Height | ↑ New Background | m | ¾ |
| 1110 / 14 | Active Position Home (APH) | | . | > | N | ↑ Hold Mosaics | n | ÷ |
| 1111 / 15 | | | / | ? | O | # Release Mosaics | o | ■ |

FIG. 2

Code Extension in a 7-Bit Environment

FIG. 3

| b4 | b3 | b2 | b1 | Row \ Column | b7 b6 b5 | 0 0 0 — 2 | 0 0 1 — 3 | 1 0 0 — 4 | 1 0 1 — 5 | 1 1 0 — 6 | 1 1 1 — 7 |
|---|---|---|---|---|---|---|---|---|---|---|---|
| 0 | 0 | 0 | 0 | 0 | | | 0 | @ | P | ` | p |
| 0 | 0 | 0 | 1 | 1 | | ! | 1 | A | Q | a | q |
| 0 | 0 | 1 | 0 | 2 | | " | 2 | B | R | b | r |
| 0 | 0 | 1 | 1 | 3 | | # | 3 | C | S | c | s |
| 0 | 1 | 0 | 0 | 4 | | $ | 4 | D | T | d | t |
| 0 | 1 | 0 | 1 | 5 | | % | 5 | E | U | e | u |
| 0 | 1 | 1 | 0 | 6 | | & | 6 | F | V | f | v |
| 0 | 1 | 1 | 1 | 7 | | ' | 7 | G | W | g | w |
| 1 | 0 | 0 | 0 | 8 | | ( | 8 | H | X | h | x |
| 1 | 0 | 0 | 1 | 9 | | ) | 9 | I | Y | i | y |
| 1 | 0 | 1 | 0 | 10 | | * | : | J | Z | j | z |
| 1 | 0 | 1 | 1 | 11 | | + | ; | K | [ | k | { |
| 1 | 1 | 0 | 0 | 12 | | , | < | L | \ | l | | |
| 1 | 1 | 0 | 1 | 13 | | - | = | M | ] | m | } |
| 1 | 1 | 1 | 0 | 14 | | . | > | N | ^ | n | ~ |
| 1 | 1 | 1 | 1 | 15 | | / | ? | O | _ | o | |

Primary Character Set

FIG. 4

Mosaic Set

FIG. 5

| | | | | Column | 10 | 11 | 12 | 13 | 14 | 15 |
|---|---|---|---|---|---|---|---|---|---|---|
| | | | | b7 | 0 | 0 | 1 | 1 | 1 | 1 |
| | | | | b6 | 1 | 1 | 0 | 0 | 1 | 1 |
| | | | | b5 | 0 | 1 | 0 | 1 | 0 | 1 |
| b4 | b3 | b2 | b1 | Row | 2 | 3 | 4 | 5 | 6 | 7 |
| 0 | 0 | 0 | 0 | 0 | Reset | Rect (Out-Lineb) | | | | |
| 0 | 0 | 0 | 1 | 1 | Domain | Rect (Filled) | | | | |
| 0 | 0 | 1 | 0 | 2 | Text | | Set & Rect (Out-Lined) | | | |
| 0 | 0 | 1 | 1 | 3 | Texture | Set & Rect (Filled) | | | | |
| 0 | 1 | 0 | 0 | 4 | Point Set (ABS) | Poly (Out-Lined) | | Numeric Data | | |
| 0 | 1 | 0 | 1 | 5 | Point Set (REL) | Poly (Filled) | | | | |
| 0 | 1 | 1 | 0 | 6 | Point (ABS) | | Set & Poly (Out-Lined) | | | |
| 0 | 1 | 1 | 1 | 7 | Point (REL) | Set & Poly (Filled) | | | | |
| 1 | 0 | 0 | 0 | 8 | Line (ABS) | Field | | | | |
| 1 | 0 | 0 | 1 | 9 | Line (REL) | Incr Point | | | | |
| 1 | 0 | 1 | 0 | 10 | Set & Line (ABS) | Incr Line | | | | |
| 1 | 0 | 1 | 1 | 11 | Set & Line REL | Incr Poly (Filled) | | | | |
| 1 | 1 | 0 | 0 | 12 | Arc (Out-Lined) | Set Color | | | | |
| 1 | 1 | 0 | 1 | 13 | Arc (Filled) | Wait | Set & Arc (Out-Lined) | | | |
| 1 | 1 | 1 | 0 | 14 | | Select Color | | | | |
| 1 | 1 | 1 | 1 | 15 | Set & Arc (Filled) | Blink | | | | |

PDI Set

FIG. 6

| b7 | 0 | 0 |
|---|---|---|
| b6 | 0 | 0 |
| b5 | 0 | 1 |

| b4 | b3 | b2 | b1 | Row \ Column | 0 | 1 |
|---|---|---|---|---|---|---|
| 0 | 0 | 0 | 0 | 0 | NUL | DLE |
| 0 | 0 | 0 | 1 | 1 | SOH | DC1 |
| 0 | 0 | 1 | 0 | 2 | STX | DC2 |
| 0 | 0 | 1 | 1 | 3 | ETX | DC3 |
| 0 | 1 | 0 | 0 | 4 | EOT | DC4 |
| 0 | 1 | 0 | 1 | 5 | ENQ | NAX |
| 0 | 1 | 1 | 0 | 6 | ACX | SYN |
| 0 | 1 | 1 | 1 | 7 | BEL | ETB |
| 1 | 0 | 0 | 0 | 8 | APB (BS) | CAN |
| 1 | 0 | 0 | 1 | 9 | APF (HT) | SS2 |
| 1 | 0 | 1 | 0 | 10 | APD (LF) | SDC |
| 1 | 0 | 1 | 1 | 11 | APU (VT) | ESC |
| 1 | 1 | 0 | 0 | 12 | CS (FF) | APS |
| 1 | 1 | 0 | 1 | 13 | APR (CR) | SS3 |
| 1 | 1 | 1 | 0 | 14 | SO | APH |
| 1 | 1 | 1 | 1 | 15 | SI | NSR |

C0 Control Set

METHOD AND APPARATUS FOR TRANSFORMING PRESTEL CODES TO NAPLPS CODES

BACKGROUND OF THE INVENTION

1. Field of the Invention

The present invention relates to a data converting method and apparatus applied to a videotex terminal for NAPLPS (North American Presentation Level Protocol Syntax), and especially to an apparatus for transforming PRESTEL codes to NAPLPS codes.

2. Prior Art of the Invention

Recently, videotex, which is a two way graphic communication system, has been developed rapidly as one of the most important new media. There are several videotex systems, one of which is PRESTEL, commercialized in the United Kingdom for the first time in the world. On the other hand, NAPLPS is standardized in the United States based on TELIDON which is the Canadian standard. The NAPLPS protocol is published by the American National Standards Institute and the Canadian Standards Association.

The PRESTEL code adopts a serial line attribute system in which color, shape, size, etc., of characters are controlled at every line but are limited to stored sets of instructions ("statically defined character sets") at the terminal.

Figure 1:
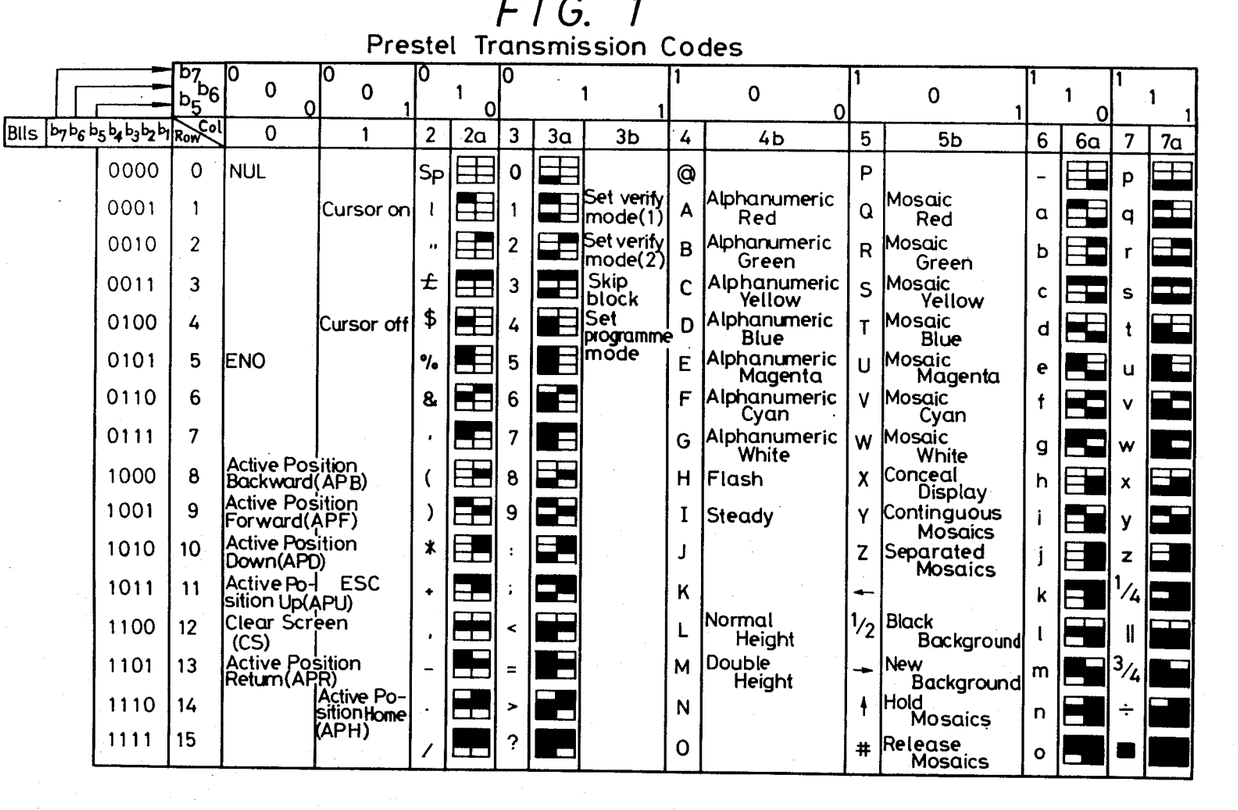
FIG. 1 shows a table of PRESTEL transmission codes.

The PRESTEL code (see FIG. 1) is roughly classified as three kinds: a character code (columns 2, 3, 6 or 7), an attribute code (escape code + columns 4 or 5) or a control code (0 or 1). For the character codes, there are alphanumeric characters such as A, B, C and so on and mosaic characters. They become characters that are displayed on the video screen. The attribute code is used to define the color, shape (alphanumeric character or mosaic figure) and the size of a display character and to define whether the color of the character to be displayed is a foreground color or a background color, etc. The control code is used to move the position at which the display character is to be displayed in the vertical and horizontal directions, to display a cursor on the video screen, to erase the cursor or to control the display of the whole of the video screen.

Figure 2:
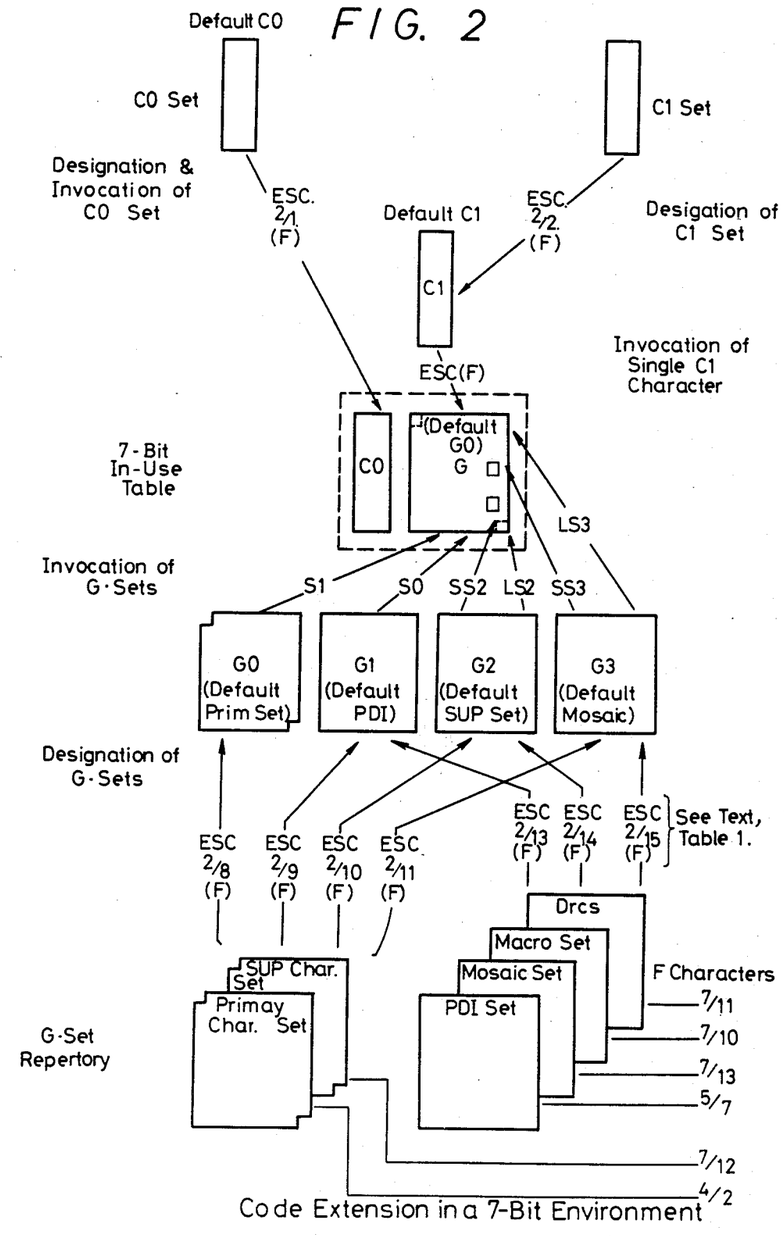
FIG. 2 shows a code extension system in a 7-bit environment of NAPLPS.

On the other hand, unlike such line attribute systems, the NAPLPS code is designed to display a wide variety of characters, figures and so on on any video screen and can even down load new character sets to the terminal.
NAPLPS Data Codes and Code Extension Procedures NAPLPS data codes are formatted into 32-character control (C) sets and 96-character graphic (G) sets as shown in FIG. 2. These sets are manipulated, for the purpose of providing a virtual address space larger than the 128 or 256 characters available in a 7-bit or 8-bit code, via code extension techniques.
Code Extension for 7-Bit Environment A code in which each data word (byte) consists of 7 information bits allows for the simultaneous representation of up to 128 characters. This 128 character absolute address space can be extended into a much larger virtual address space via the code extension procedures described below.

Figure 3:
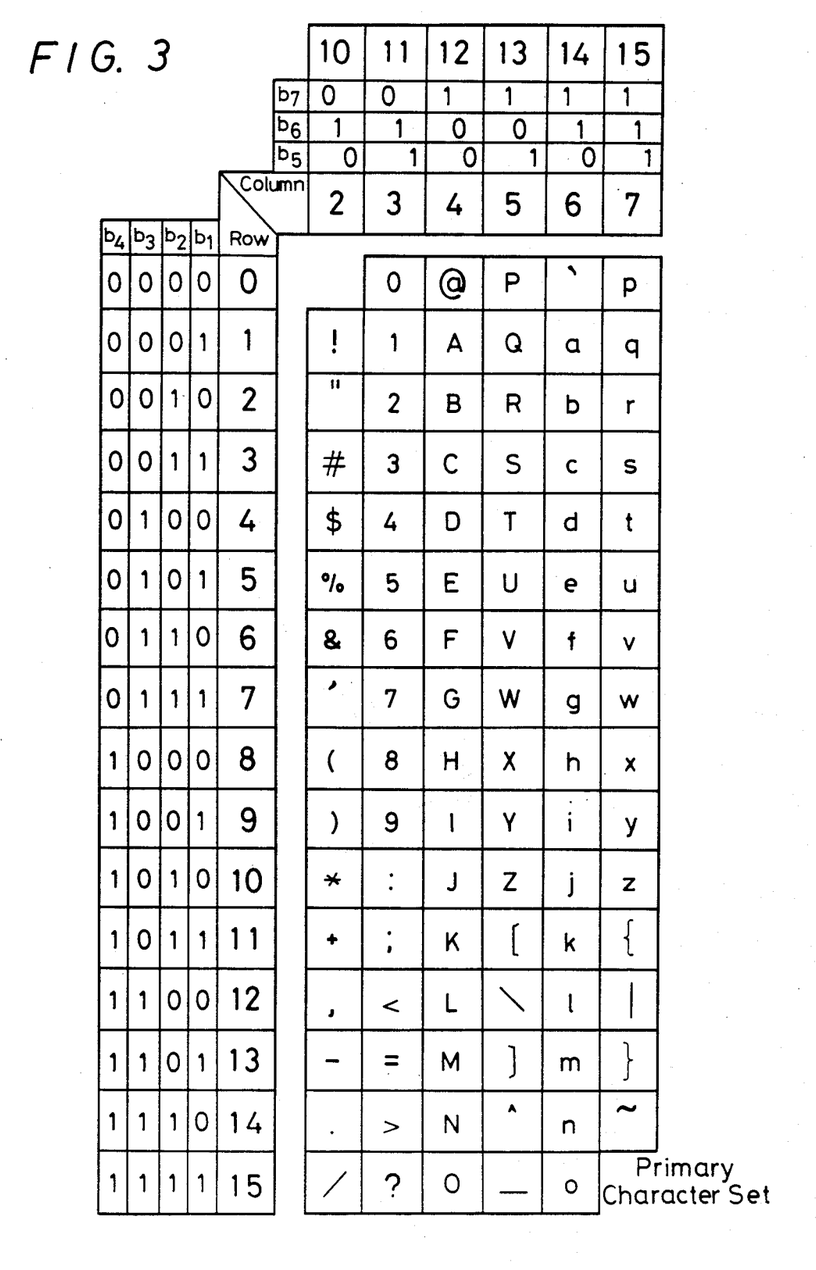
FIG. 3 shows a table of a primary character set of NAPLPS in a 7-bit environment.
Figure 4:
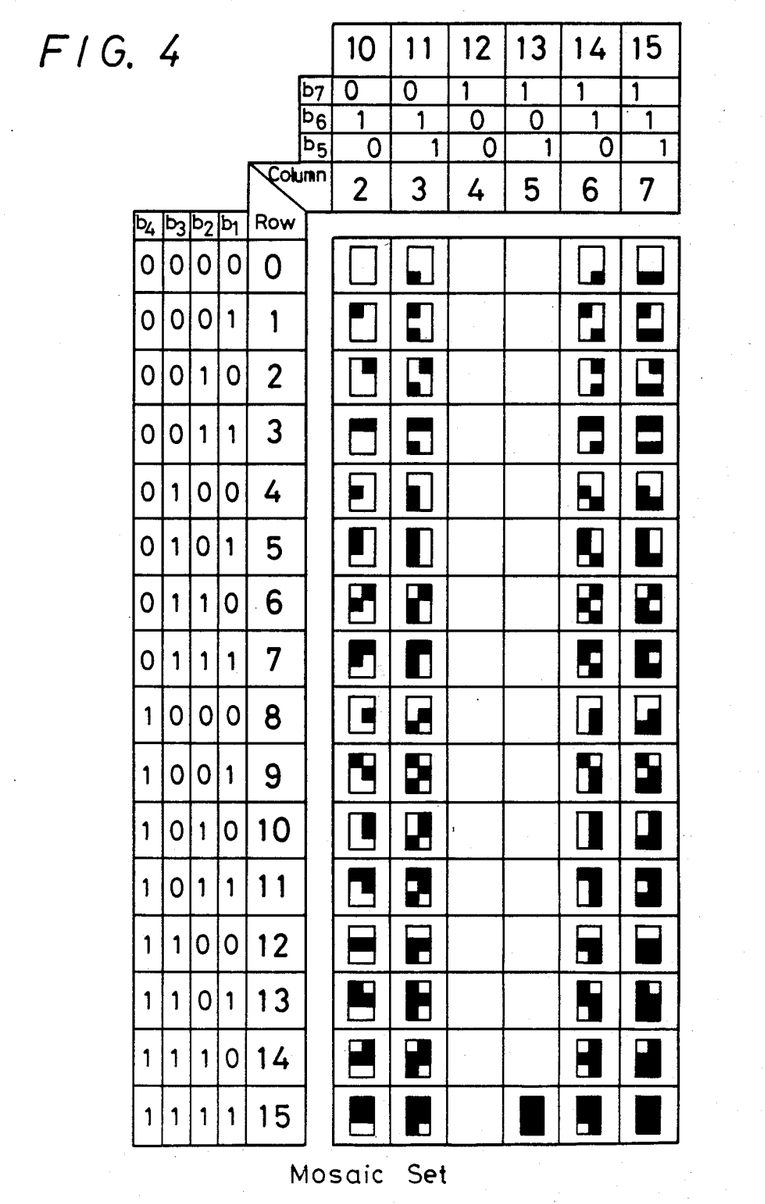
FIG. 4 shows a table of a mosaic set of NAPLPS.
Figure 5:
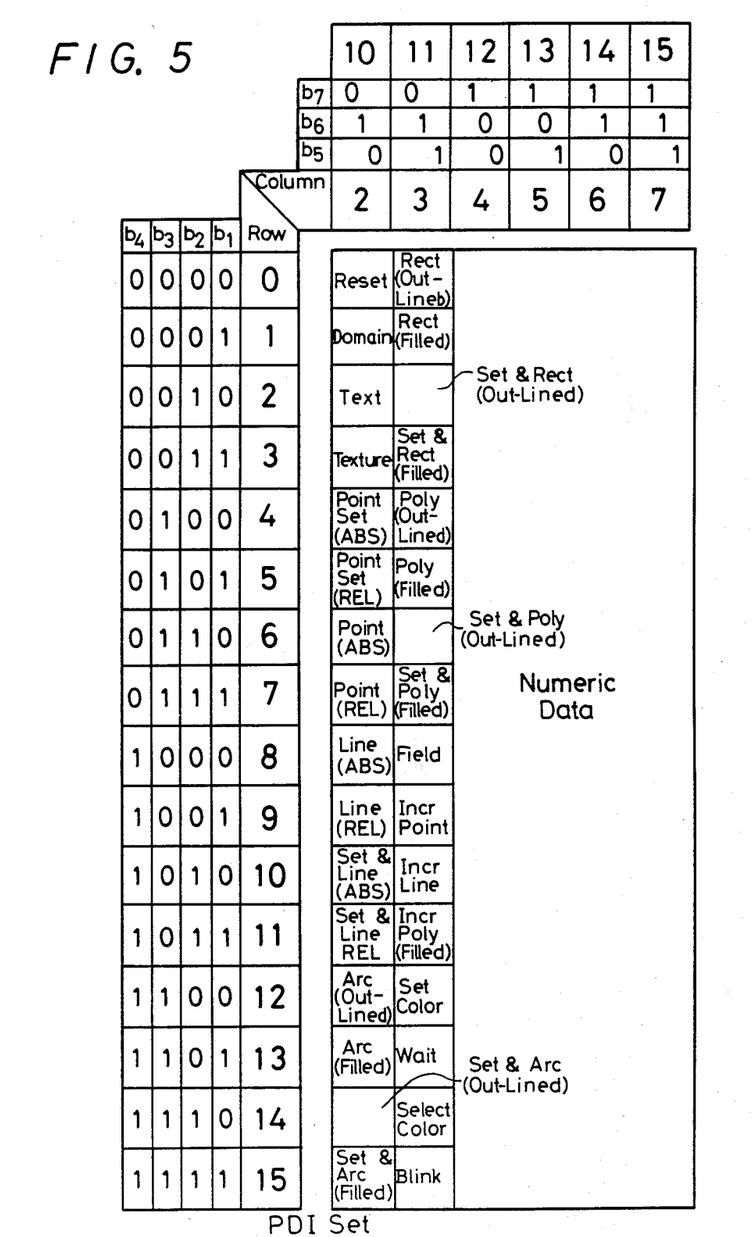
FIG. 5 shows a PDI set of NAPLPS.

A 128 character in-use table is defined within the terminal's memory. Each incoming character is either decoded according to the current contents of this table or is used to change the contents of this table. The table itself (FIG. 2) is organized into eight columns of sixteen rows, with bits 1 through 4 defining the row number and bits 5 through 7 defining the column number. The in-use table always contains, in columns 0 and 1 (FIG. 6) the control code. Five characters of this control set, escape (ESC or 1/11, i.e., column 1, row 11), shift-in (SI or 0/15), shift-out (SO or 0/14), single-shift 2 (SS2 or 1/9), and single-shift 3 (SS3 or 1/13), are used to control the contents of the remaining six columns of the in-use table (FIGS. 3, 4, 5). The manner in which this is accomplished is graphically depicted in FIG. 2.

As shown in FIG. 2, four active graphic sets, the G0, G1, G2 and G3 sets are defined and can be dynamically selected from the larger graphics repertory by using three character escape sequences as shown. These sequences take the form ESC, I, F where I is the intermediate character and F is the final character. The intermediate character determines which set is to be changed (redesignated).

The final character determines which set from the graphics repertory is to be selected. The F character for the ASCII alphanumerics is assigned as 4/2. The three character escape sequence ESC, 2/8, 4/2, therefore, designates the ASCII alphanumerics as the current G0 set.

The shift-in (SI) character is used to invoke the current G0 set into the in-use table where it remains until further control action is taken (i.e., it is invoked in a locking manner). The shift-out (SO) character is used to invoke the current G1 set into the in-use table in a locking manner. The sequence locking shift 2 (LS2) is used to invoke the G3 set into the in-use table in a locking manner. The single-shift characters, SS2 and SS3, are used to invoke, in a non-locking manner, the G2 or G3 set, respectively, into the in-use table. (The range of the single-shift characters extends only to the next character received, that is, the in-use table automatically reverts to its former state after the character immediately following the single-shift is interpreted.) If any of the G sets are re-designated via a three character escape sequence while it is in the in-use table, the new code interpretations are simultaneously invoked, that is, a locking shift is not required for the change to take effect.

Upon initialization (e.g., power-up of the terminal), the ASCII alphanumerics are designated as the G0 set and the G0 set is invoked into the in-use table. The PDI codes are designated as the G1 set, Supplementary Graphics Characters are designated as the G2 set, and Mosaics are designated as the G3 set.
Graphic Sets This section defines the graphic sets that can be used in conjunction with the code extension schemes described. Each graphic set consists of 96 character positions arranged in six columns by sixteen rows. Any one of these sets can be designated as any one of the four active G sets at any time. In a 7-bit environment these sets, when invoked, would occupy columns 2 through 7 of the in-use table. (See FIGS. 2, 3 and 4.)
8-Bit Environment Similar coding schemes apply where an 8-bit code word is used. These are explained in the NAPLPS specification referred to above. It is to be understood that the present invention is not limited in its application to either the 7 or 8 bit code environment.

Further explanation is available in the NAPLPS specification of the American National Standards Institute and the Canadian Standards Association, described further herein. See also U.S. Pat. No. 4,439,761, which describes terminal generation of dynamically redefinable character sets.

Since the contents of the PRESTEL code and the NAPLPS code are different from each other as described above, the PRESTEL code cannot be directly decoded by a user terminal apparatus which can decode, for example, the NAPLPS code. However, if the NAPLPS user terminal apparatus can receive the PRESTEL code and can display a corresponding picture on a monitor receiver, this is very convenient for the user. This is also desirable for a work station of NAPLPS frame creation system (FCS). Such an apparatus, however, has not yet been developed.

In providing such an apparatus which would allow a PRESTEL code received by a NAPLPS user terminal apparatus to be decoded and converted to the NAPLPS code and then the corresponding picture displayed on the monitor thereof, a method of converting the PRESTEL code to the NAPLPS code is an important factor. Depending on the conversion method, there is a possibility that a NAPLPS encoder will become very complicated in construction and the hardware of the NAPLPS user terminal apparatus will have to be considerably modified.

OBJECTS AND SUMMARY OF THE INVENTION

Accordingly, it is an object of the invention to provide an apparatus for converting PRESTEL codes to NAPLPS codes.

It is another object of the invention to provide such apparatus in which PRESTEL codes are transformed to NAPLPS codes with a simple procedure.

It is a further object of the present invention to easily convert the PRESTEL code to the NAPLPS code by only adding PRESTEL decoder hardware in a NAPLPS terminal.

In the apparatus of this invention, an input PRESTEL code is identified as to whether it is a control code, an attribute code, or a character code. If the identified code is a control code, a corresponding NAPLPS code is output from the Co set from the in-use table.

For an attribute code, it is further determined whether the code designates an alphanumeric character or a mosaic character of the NAPLPS primary character set or the mosaic set which are registered for example in the $G_0$ and $G_1$ of G set, respectively, and if so, such character is invoked to the in-use table by the locking shift code. If the attribute code designates a color of the following character, the PDI (Picture Description Instruction) set, which is registered for example to $G_2$ of G set, is invoked temporarily to the in-use table by the single shift character and a color select code and a color code which represent the same color as what is defined by the attribute code.

In case of a character code, a corresponding code is output from a primary character set or a mosaic set which was already invoked to the in-use-table by the locking shift character.

Accordingly, PRESTEL codes are transformed to NAPLPS codes.

These features and advantages of the present invention will become more apparent upon a perusal of the following specification taken in conjunction with the accompanying drawings wherein similar characters of reference refer to similar structures in each of the separate views.

DESCRIPTION OF THE PREFERRED EMBODIMENT

The code extension system of NAPLPS has been briefly explained above referring to the drawings 1 to 6. A more detailed explanation can be found in the publication: "CSA T500-198x ANSI BSR x 3.110 - 198x, Sept. 9, 1983," by the American National Standards Institute and the Canadian Standards Association, at pages 11 to 17, beginning at line 11.

Figure 7:
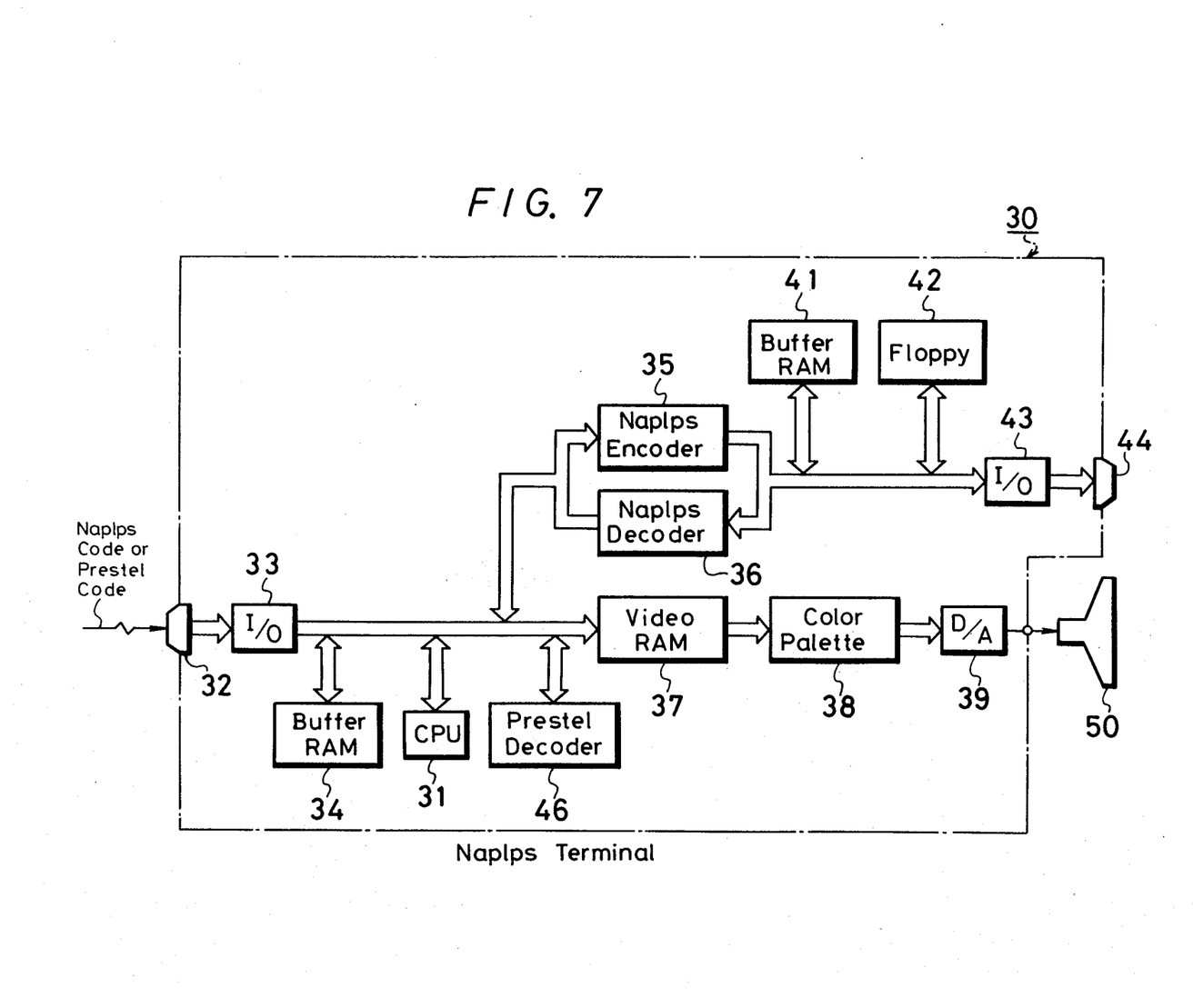
FIG. 7 shows a block diagram of an apparatus of the present invention.

FIG. 7 shows an embodiment in which a data converting apparatus according to the present invention is applied to the videotex user terminal apparatus of the above NAPLPS system. This user terminal apparatus 30 includes, in addition to CPU 31, a PRESTEL decoder 46 for decoding the PRESTEL code and a NAPLPS encoder 35, in which, on the basis of a command from the CPU 31, the PRESTEL code is decoded and encoded. In other words, in this user terminal apparatus which functions as the workstation, the picture image processing, the data conversion and so on are executed by the computer 31.

Picture data (NAPLPS code or PRESTEL code data) applied to a connector 32 is latched through an I/O port 33 to buffer RAM 34 once. When the picture data is read out therefrom in the PRESTEL code, the content of such data is decoded by the PRESTEL decoder 46 and the decoded data is stored in the memory of the PRESTEL decoder 46. The stored, decoded data is then fed to the NAPLPS encoder 35 in which it is converted to the NAPLPS code. This converted data is again decoded by the NAPLPS decoder 36 and is written in a video RAM 37. When the picture data is in the NAPLPS code, it is supplied through the NAPLPS encoder 35 to the NAPLPS decoder 36, as required. The G and Co sets are logically produced by the CPU 31 from work RAMs and ROM, which are provided in both the NAPLPS encoder 35 and the NAPLPS decoder 36. The in-use table resides in the work RAM provided in the encoder 35 and decoder 36.

The data stored in the video RAM 37 is used as an address specifying data for a color palette 38. The color palette 38 is provided so as to achieve the following purpose. Although picture data R, G, and B received by the user terminal apparatus are each converted to 4 bit digital data, there is a possibility that the picture data will represent $2^{12}=4096$ colors at a maximum. Such picture data are not written in the video RAM 37 as is but instead the picture data of 4096 colors are converted to picture data having only 16 colors, and a picture is displayed on the basis of such corresponding picture data.

The picture data corresponding to 16 colors are stored in the encoder 35 as specified by the received NAPLPS code. At the same time, the color palette 38 is provided such that it can reproduce the color picture of at least 16 colors. The address of this color palette 38 is specified by the picture data stored in the video RAM 37.

The picture data read out from the color palette 38, and of which the specific color is specified, is converted to an analog signal by a D/A converter 39 and is then fed to a monitor 50, for displaying the color picture on the monitor.

The NAPLPS code picture data stored in the encoder 35 is stored in a buffer RAM 41 or a floppy disk 42 or is stored in both of them and can also be delivered through an I/O port 43 to an output connector 44. The data from the output connector 44 is transmitted to the host computer side via a data network line such as a telephone network line and so on.

In the case of the NAPLPS system, a desired picture is displayed on the picture screen 50 by registering the necessary G set repertory and invoking the desired set to the in-use table. As is known well, the G set repertory includes a primary character set, a supplementary set, a PDI (Picture Description Instruction) set, a mosaic set and so on, as explained above in reference to FIG. 2.

According to the present invention, the PRESTEL code is converted to the NAPLPS code in the manner now to be described. Most of the PRESTEL alphanumeric characters and mosaic characters correspond to the NAPLPS primary character set code and so can be used directly without conversion from one protocol to the other. For example, the alphanumeric character "C" is coded 4/3 (binary code 1100001) in PRESTEL (FIG. 1) and NAPLPS (FIG. 3).

In the case of the PRESTEL attribute code, the primary character set and the mosaic set are selectively invoked to the in-use table by locking shift command and further the color of a character, for example, is determined by invoking the PDI set to the in-use table by the single shift command. In the case of the control code, the control set ($C_0$ set) which is always invoked to the in-use table of the NAPLPS is used. Again, most PRESTEL control codes are the same as NAPLPS control codes. Thus, the necessary picture information is obtained, such as what column in what line of the received PRESTEL data is to be described next, the color, the shape and the size of the character to be displayed on that column and so on. In this way, the PRESTEL code is made to correspond to the NAPLPS code and is converted.

Figure 8:
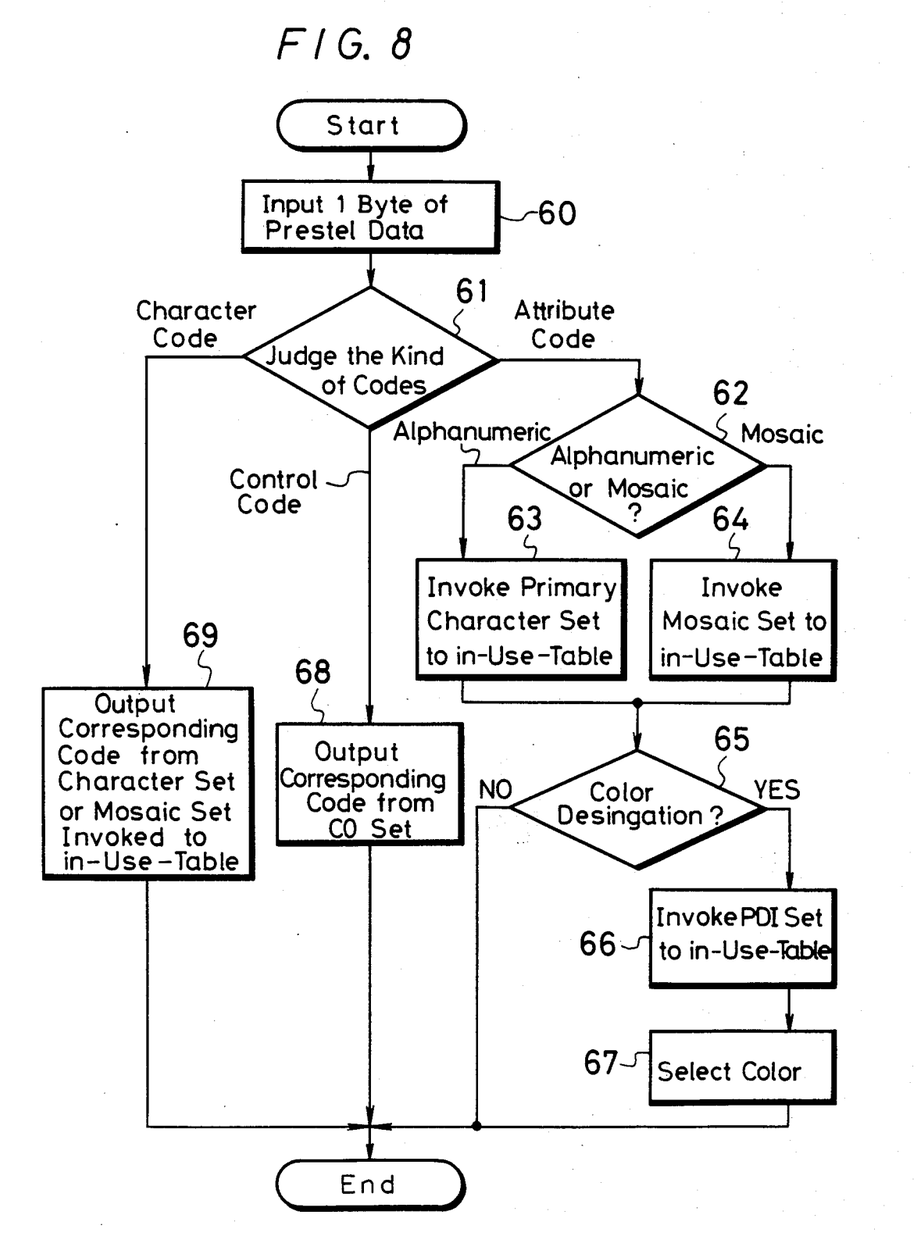
FIG. 8 shows a flow chart for the explanation of the procedure of the code conversion.

FIG. 8 is an example of a flow chart, by which the CPU 31, when the PRESTEL code is inputted, is programmed to convert it to the NAPLPS code.

When the code conversion program is started, at step 60, one data byte of the PRESTEL code data is inputted and the kind of data is identified on the basis of the command from the CPU 31 at step 61.

If at step 61 the code is determined to be indicative of the attribute type, then the CPU 31 next determines whether this attribute code designates an alphanumeric character or a mosaic character at step 62. If the attribute code designates the alphanumeric character, the program goes to step 63 at which the primary character set is invoked to the in-use table.

In this embodiment, for the sake of explanation, it is assumed that the primary character set has been previously registered in the $G_0$ set, and it is also similarly assumed that the mosaic set is registered in the $G_1$ set, the PDI set is registered in the $G_2$ set and the supplementary set is registered in the $G_3$ set, respectively. Accordingly, in the above mentioned case, the $G_0$ set is invoked at step 63.

If, on the other hand, at step 62 the attribute character is identified as mosaic code, the program goes to step 64 where the mosaic set in the $G_1$ set is invoked to the in-use table. After the corresponding sets are invoked at steps 63 or 64, to the in-use table, respectively, at step 65, the CPU 31 checks whether the color is specified or not. If the color is specified, the PDI set is invoked by the CPU to the in-use table at step 66 and the setting of the corresponding color is executed by using the PDI set at step 67. If, on the other hand, the color is not yet specified, the program is ended.

In the apparatus of this invention the color map is already set for PRESTEL colors. That is, the color map addresses and color values are fixed. For example, if the color map is set as FIG. 25 on page 53 of the NAPLPS specification referred to above, color map address 1, 0, 0, 0 is designated for blue color, color map address 1010 is designated for red color and so on. Therefore, when PRESTEL code of 1/11, 4/4 is received, the NAPLPS encoder 35 in FIG. 7 produces SELECT COLOR COMMAND 3/14 and the color map address 6/0 or 6/1 or 6/2 or 6/3 from the PDI set (because 6/0, 6/1, 6/2 and 6/3 have 1,0,0,0 from most significant bit (MSB). The two last bits are ignored since the address code if four bits. The actual codes are as follows

| X | 0 | 1 | 1 | 1 | 1 | 1 | 0 | (3/14: SELECT COLOR)

| X | 1 | 1 | 0 | 0 | 0 |  |  |
(6/0 or 6/1 or 6/2 or 6/3: color map address code of blue)

Please note that correspondence between color addresses and color values can be selected as desired.

In the NAPLPS encoder 35, a corresponding address code of the color map to a PRESTEL color code is output from the PDI set by the CPU 31.

If at step 61 the input data is determined to be the control code, the corresponding NAPLPS code is outputted by the CPU from the Co set and is invoked to the in-use table at the step 68. It will be recalled that the NAPLPS and PRESTEL control codes are, for the most part, the same.

When the input data is a code indicative of the character code, the program goes to step 69 where the PRESTEL character code is converted to the corresponding NAPLPS code under the control of the CPU 31.

Between the alphanumeric set of PRESTEL and the primary character set of NAPLPS, and between the mosaic set of PRESTEL and the mosaic set of NAPLPS, some of the characters are different in only a part of the code and other character codes correspond to one another. Therefore, when the codes are identical with each other, the same code is outputted from the primary character set or mosaic set which was already invoked to the in use table when the attribute code was detected.

When the character codes which are inputted are different between PRESTEL and NAPLPS, code conversion is executed. For example, the code indicative of #(5/15) in the PRESTEL code corresponds to the code indicative of an underline in the NAPLPS code (see FIG. 3) so that in this case, the PRESTEL code is converted to the NAPLPS code (code 2/3 of the primary character set) indicative of #. (In specifying codes, the column is given first, followed by the row.)

Now, for help in understanding the operation of the apparatus of this invention, an example of a transformation of a PRESTEL code to a NAPLPS code will be explained with reference to the FIGS. 8 and 9.

Assume that PRESTEL code sequence 1/11, 4/4, 0/10, 4/3 orders the display of a blue alphanumeric C to move down the normal display position by one line and that this code sequence is input to the user terminal apparatus 3 after PRESTEL code sequences that have commanded the display of an alphanumeric A and B on the same line have already been received. In the above PRESTEL codes, 1/11 and 4/4 is an attribute code as a whole; 11/1 representing an escape code and 4/4 (i.e., "D") alphanumeric blue, 20/10 is a control code representing active position down, and 4/3 is a display code representing alphanumeric character C. (See FIG. 1).

Figure 9:
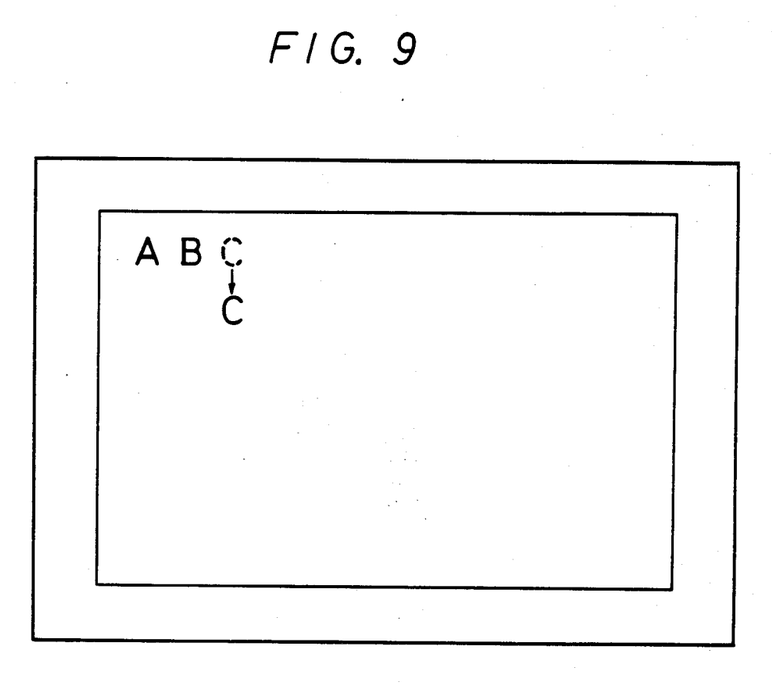
FIG. 9 shows an example of displaying alphanumeric characters on a screen.

FIG. 9 shows how the character of the above PRESTEL code sequence is displayed on the screen.

Referring again to FIG. 8, the PRESTEL codes are identified under the control of the programmed CPU 31 at the step 60. Since the first code 1/11, 4/4 is identified as an attribute code, which is always composed of the escape code 1/11 and the subsequent code among columns 3b, 4b and 5b in the table of FIG. 1, the flow goes to the step 62. As 4/4 ("D") represents alphanumeric blue, the primary character set in $G_0$ set is invoked to the in-use table in FIG. 2 by using SI code (0/15) which is locking shift, in control set Co in the step 63.

The flow next goes via the step 65 to the step 66, in which the PDI set in $G_2$ set is invoked to the in-use table by SS2 code which is single shift, in control set Co. In the step 67, SELECT color code 3/14 (see FIG. 5) and the subsequent numeric data that specifies the address of blue in the color map are output from the PDI set (provided that SET color has already been done).

Figure 6:
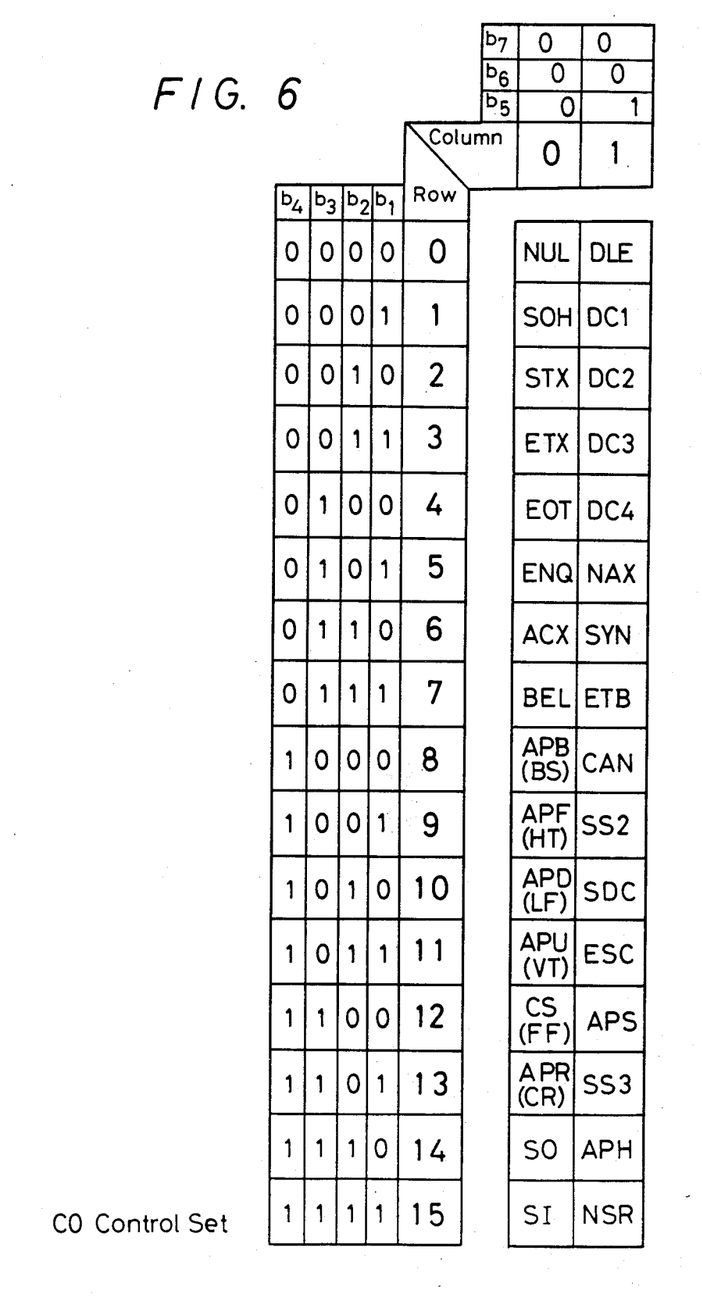
FIG. 6 shows a Co control set of NAPLPS.

The following code 0/10 is a control code, so the flow goes to the step 68, wherein the corresponding code 0/10 from the NAPLPS Co set is output (cf. FIG. 6). Since the last code 4/3 is a display code, the flow goes to the step 69, wherein the corresponding NAPLPS color code is output. In the step 69, there is no need to invoke the primary character set to the in-use table, because it has already been invoked to the in-use table in the step 63 by locking shift. Accordingly, the input PRESTEL code 1/11, 4/4, 0/10, 4/3 is transformed to the NAPLPS code 3/14 (select color map address code of blue, 0/10 (active position down one line), 4/3 (alphanumeric character C). With the above NAPLPS codes, a blue C is displayed one line down on the screen from "A" and "B" as shown in FIG. 9.

In the above embodiment an attribute code was transformed to corresponding NAPLPS code by invoking the PDI set to the in-use table, however a MACRO set can also be used instead. (See page 94 of the NAPLPS publication.)

The terms and expressions which have been employed here are used as terms of description and not of limitations, and there is no intention, in the use of such terms and expressions, of excluding equivalents of the features shown and described, or portions thereof, it being recognized that various modifications are possible within the scope of the invention claimed.

I claim:

1. A method of automatically transforming PRESTEL codes to NAPLPS codes utilizing NAPLPS code extension, the method comprising the following steps of:
   receiving a PRESTEL code signal;
   identifying whether said PRESTEL code signal is an attribute code, a control code, or a character code;
   transforming an attribute code signal to a corresponding NAPLPS code signal by invoking a graphic function code set to an in-use table;
   transforming a control code signal to a corresponding NAPLPS control code signal in a Co set invoked to the in-use table; and
   transforming a character code signal to a corresponding NAPLPS character code signal in the primary character set or mosaic set invoked to the in-use table.

2. A method of transforming PRESTEL code signals to NAPLPS code signals utilizing NAPLPS code extension, the method comprising the following steps of:
   receiving a PRESTEL code signal;
   identifying whether said PRESTEL code signal belongs to an attribute code, a control code, or a character code;
   further identifying whether the attribute code attributes to alphanumeric characters or to a mosaic character when said PRESTEL code is identified as an attribute code;
   invoking the primary character set or the mosaic set to the in-use table from the G sets in accordance with said attribute code identification;
   identifying whether said attribute code signal designates a color;
   invoking PDI (Picture Description Instruction) set to the in-use table from the G sets, when said attribute code signal designates a color;
   deriving a select color code and subsequent color data code of NAPLPS from said PDI set;
   deriving a corresponding NAPLPS control code from the Co set invoked to the in-use table, when said PRESTEL code is identified as a control code; and
   deriving a corresponding NAPLPS alphanumeric code or a NAPLPS mosaic code from said primary character set or said mosaic set invoked to the in-use table, when said PRESTEL code is identified as a character code signal.

3. A method as recited in claim 2, in which said primary character set and said mosaic set are selectively invoked by a locking shift code signal and said PDI set is invoked by a single shift code signal.

4. A method as recited in claim 3, in which said locking shift signal is produced by designating SI or SO code in the Co set and said single shift is produced by designating SS2 or SS3 code in the Co set.

5. In a terminal of the type having a programmed computer, a data memory which includes at least one in-use look-up table and look-up tables for codes for a control code (Co) set and graphic display (G) sets, including picture description instruction ("PDI") sets, a primary character set and a mosaic set, which look-up tables can be selectively invoked to the in-use tables, the improvement of apparatus for transforming PRESTEL codes to NAPLPS codes utilizing NAPLPS code extension, wherein such apparatus comprises:

an input terminal for receiving a PRESTEL code;

means for identifying whether said PRESTEL code belongs to an attribute code, a control code or a character code;

means for transforming a received attribute code to a corresponding NAPLPS code by invoking a graphic function set to the in-use table, when said PRESTEL code is identified as an attribute code;

means for transforming a received control code to a corresponding NAPLPS control code in the Co set invoked to the in-use table, when said PRESTEL code is a control code; and means for transforming a character code to a corresponding NAPLPS character code in the primary character set or mosaic set invoked to the in-use table, when said PRESTEL code is identified as a character code.

6. Terminal apparatus as recited in claim 5 wherein said attribute transforming means comprises:

means for identifying whether the attribute code attributes to alphanumeric characters or to mosaic characters;

means for invoking the primary character set or the mosaic set to the in-use table from the G sets in accordance with said attribute code identification;

means for identifying whether said attribute code designates a color;

means for invoking the PDI (Picture Description Instruction) set to the in-use table from the G sets, when said attribute code designates a color; and means for deriving a select color code and subsequent color data code of NAPLPS from said PDI set.

7. Terminal apparatus as recited in claims 5 or 6, in which said primary character set and said mosaic set are selectively invoked by producing a locking shift signal and said PDI set is invoked by producing a single shift signal.

8. Terminal apparatus as recited in claim 7, in which said locking shift is operated by designating SI or SO code in the Co set and said single shift is operated by designating SS2 or SS3 code in the Co set.

9. Terminal apparatus as recited in claim 8, further comprising means for storing said derived NAPLPS codes.

10. Terminal apparatus as recited in claim 9, further comprising means for decoding said derived NAPLPS codes and means for displaying the information represented by said decoded code signals.

11. Terminal apparatus as recited in claim 10, further comprising an output terminal for outputing said derived NAPLPS codes.

12. Terminal apparatus as recited in claim 5 further comprising means for receiving, decoding and displaying NAPLPS encoded signals.

* * * * *